(12) United States Patent
Liu et al.

(10) Patent No.: US 7,900,125 B1
(45) Date of Patent: Mar. 1, 2011

(54) MAJORITY DETECTION IN ERROR RECOVERY

(75) Inventors: Jingfeng Liu, Longmont, CO (US);
Bernardo Rub, Sudbury, MA (US);
Peihui Zheng, Medfield, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 1003 days.

(21) Appl. No.: 11/606,416

(22) Filed: Nov. 30, 2006

Related U.S. Application Data

(63) Continuation-in-part of application No. 11/135,978, filed on May 24, 2005, now abandoned.

(60) Provisional application No. 60/573,855, filed on May 24, 2004.

(51) Int. Cl.
*G06F 11/00* (2006.01)

(52) U.S. Cl. .................. 714/799; 714/760; 714/797; 714/776

(58) Field of Classification Search ............... 714/760, 714/752, 797, 759, 793, 799, 822, 776
See application file for complete search history.

(56) References Cited

U.S. PATENT DOCUMENTS

| | | | |
|---|---|---|---|
| 4,404,674 A | | 9/1983 | Rhodes |
| 4,404,677 A | * | 9/1983 | Grande et al. ............... 714/822 |
| 4,942,578 A | * | 7/1990 | Nakamura .................. 714/797 |
| 5,721,816 A | * | 2/1998 | Kusbel et al. ................. 714/15 |
| 5,864,654 A | | 1/1999 | Marchant |
| 6,038,679 A | | 3/2000 | Hanson |
| 6,519,740 B1 | | 2/2003 | Martensson |
| 7,076,721 B2 | * | 7/2006 | Sawaguchi .................. 714/755 |
| 7,634,706 B1 | * | 12/2009 | Chen et al. .................. 714/760 |
| 2003/0196159 A1 | | 10/2003 | Kondo et al. |
| 2005/0262423 A1 | | 11/2005 | Liu et al. |

OTHER PUBLICATIONS

U.S. Appl. No. 60/573,855, entitled Majority Detection in Error Recovery, by Liu et al., on May 24, 2004.
Prosecution Documents Associated with U.S. Appl. No. 11/135,978 including: Notice of Abandonment mailed on Feb. 21, 2008, Office Action mailed on Aug. 10, 2007, Application as filed on May 24, 2005.

* cited by examiner

*Primary Examiner*—Fritz Alphonse
(74) *Attorney, Agent, or Firm*—Theodore M. Magee; Westman, Champlin & Kelly, P.A.

(57) ABSTRACT

One or more techniques provide majority detection in error recovery. Accordingly, a device retries reading an ECC codeword having one or more bits for a plurality of retries, and stores each retry. The device ("hard" majority detection) votes on a value of each bit of the codeword based on a majority of corresponding retry values in the plurality of corresponding retries. Also, the device ("soft" majority detection) may determine reliability information for a value of each bit of the codeword based on a reoccurrence ratio of corresponding retry values in the plurality of retries. The device may declare erasures based on the reliability information and a (dynamically adjusted) threshold of uncertainty, e.g., where an "uncertain" bit based on the threshold or any symbol with an "uncertain" bit is declared as an erasure.

20 Claims, 7 Drawing Sheets

| BITS 300, e.g., OF SYMBOL 310 | 0 | 1 | 2 | 3 | 4 | 5 | 6 | 7 | 8 | 9 |
|---|---|---|---|---|---|---|---|---|---|---|
| FIRST     | 1 | 1 | 0 | 0 | 0 | 1 | 1 | 0 | 0 | 1 |
| SECOND    | 1 | 1 | 1 | 0 | 0 | 1 | 0 | 0 | 1 | 1 |
| THIRD     | 1 | 0 | 1 | 1 | 0 | 1 | 1 | 0 | 1 | 1 |
| FOURTH    | 1 | 0 | 1 | 0 | 0 | 1 | 0 | 0 | 0 | 1 |
| FIFTH     | 1 | 1 | 1 | 0 | 0 | 1 | 1 | 0 | 0 | 1 |
| MAJORITY VOTING | 1 | 1 | 1 | 0 | 0 | 1 | 1 | 0 | 0 | 1 |

HARD MAJORITY DETECTION TABLE 400

FIG. 4

| BITS 300, e.g., OF SYMBOL 310 | | 0 | 1 | 2 | 3 | 4 | 5 | 6 | 7 | 8 | 9 |
|---|---|---|---|---|---|---|---|---|---|---|---|
| RETRIES | FIRST | 1 | 1 | 0 | 0 | 0 | 1 | 1 | 0 | 0 | 1 |
| | SECOND | 1 | 1 | 1 | 0 | 0 | 1 | 0 | 0 | 1 | 1 |
| | THIRD | 1 | 0 | 1 | 1 | 0 | 1 | 1 | 0 | 1 | 1 |
| | FOURTH | 1 | 0 | 1 | 0 | 0 | 1 | 0 | 0 | 0 | 1 |
| | FIFTH | 1 | 1 | 1 | 0 | 0 | 1 | 1 | 0 | 0 | 1 |
| RELIABILITY INFO – 1'S | | 1 | 0.6 | 0.8 | 0.2 | 0 | 1 | 0.6 | 0 | 0.4 | 1 |
| RELIABILITY INFO – 0'S | | 0 | 0.4 | 0.2 | 0.8 | 1 | 0 | 0.4 | 1 | 0.6 | 0 |

SOFT MAJORITY DETECTION TABLE 600

| e.g., THRESHOLD OF UNCERTAINTY = 0.75 | 1 | "U" | 1 | 0 | 0 | 1 | "U" | 0 | "U" | 1 |
|---|---|---|---|---|---|---|---|---|---|---|

FIG. 6

MAJORITY DETECTION IN ERROR RECOVERY

CROSS-REFERENCE TO RELATED APPLICATIONS

The present application is a continuation-in-part of commonly assigned U.S. patent application Ser. No. 11/135,978 now abandoned, which was filed on May 24, 2005, by Liu et al. for MAJORITY DETECTION IN ERROR RECOVERY, now published as U.S. Patent Application Publication No. US2005/0262423 A1, which claims priority from U.S. Provisional Application No. 60/573,855, filed May 24, 2004, entitled MAJORITY DETECTION IN ERROR RECOVERY, the contents of both of which are hereby incorporated by reference.

BACKGROUND OF THE INVENTION

1. Field of the Invention

The invention relates generally to error correction systems and, more particularly, to systems for error and erasure detection and correction.

2. Background Information

Before data is transmitted over a communications channel to a receiver or a data storage device, the data is typically encoded to allow for error detection and/or correction. The error correction/detection encoding may manipulate the data in accordance with a distance "d" error correction code ("ECC"), to produce ECC codewords that include the data and associated redundancy information. To decode the data and associated redundancy information from received or retrieved signals, the decoder first recovers the bits and then may group the bits into symbols or sequences of appropriate length for the ECC, and thus, reproduces the ECC codewords. The system next decodes the ECC codewords using the ECC to produce, if possible, error-free data. Typically, an (n, k) distance d Reed-Solomon ECC is used to encode data that is to be stored for later retrieval, and the ECC decoder is an on-the-fly hardware decoder that detects and corrects up to "t" errors using 2t=n−k redundancy symbols, where the minimum distance is $d_{min}=2t+1$. Also, Reed-Solomon ECC may correct up to $\rho=d_{min}-1$ erasures, or simultaneously a random errors and $\rho$ erasures, provided that $2\alpha+\rho<d_{min}$ (as will be understood by those skilled in the art). Other examples of on-the-fly hardware decoders include, e.g., parity check decoders, media noise optimized Viterbi detectors, etc., as will be understood by those skilled in the art.

When a sector of a storage medium is "marginal," such that retrieval of the data stored therein is impaired by, for example, a defect in the medium or a degradation of the signal that represents the data, the system may determine that the stored data contains more errors than the ECC can correct. The system then tries to recover the data through error recovery operations. Generally, the error recovery operations involve up to a predetermined number of re-reads ("retries") of the data, in which the error correction operations are performed independently for the respective re-reads. Often, the number of retries is limited by a specified "time-out" length of time. For example, the error recovery operations may spend up to several hundred retries attempting to recover the data.

The error recovery operations may include re-reading the data (e.g., from a disk) with a read head at various off-track positions, with an increased bias current, using modified filter responses, and so forth, to improve the quality of the read-back signal. However, such attempts may not recover the data or offer a sufficient improvement such that the number of errors included therein is within the error correction capability of the ECC.

There remains a need, therefore, for a technique that efficiently retries the reading of erroneous data that is originally beyond the correction capability of the ECC, in order to supply more useful information to the ECC.

SUMMARY OF THE INVENTION

The present invention is directed to majority detection in error recovery. According one or more embodiments described herein, a device retries reading an ECC codeword (e.g., having bits and/or symbols) for a plurality of retries, and stores each retry. The device (e.g., for "hard" majority detection) may then vote on a value of each bit of the codeword based on a majority of corresponding retry values in the plurality of corresponding retries. Also, according to one or more embodiments described herein, the device (e.g., for "soft" majority detection) may determine reliability information for a value of each bit of the codeword based on a reoccurrence ratio of corresponding retry values in the plurality of retries. The device may then declare erasures (e.g., bits and/or symbols) based on the reliability information and a threshold of uncertainty, e.g., where an "uncertain" bit based on the threshold or any symbol with an "uncertain" bit is declared as an erasure to assist error correction. Further, the threshold of uncertainty may be adjusted to declare either more or fewer erasures to further assist error correction. (Notably, a threshold of uncertainty equal to 50% is substantially similar to hard majority detection, e.g., no bits are "uncertain".)

Advantageously, the invention provides efficient techniques for majority detection in error recovery (e.g., correction and/or detection). By providing additional reliability information through a comparison of multiple read retries, the novel techniques provide an additional input to error detection and correction. Further, the inventive system utilizes the hard and soft majority detection to recover data that would otherwise be labeled as uncorrectable, or bad, because the number of errors exceeds the error correction capability of the ECC.

BRIEF DESCRIPTION OF THE DRAWINGS

The above and further advantages of the invention may be better understood by referring to the following description in conjunction with the accompanying drawings in which like reference numerals indicate identically or functionally similar elements, of which:

FIG. 4 illustrates a table of an example result of performing re-reads (retries) and hard majority detection voting for a symbol in accordance with the present invention;

FIG. 6 illustrates a table of an example result of performing re-reads (retries) and determining soft majority detection reliability information for a symbol in accordance with the present invention.

DETAILED DESCRIPTION OF ILLUSTRATIVE EMBODIMENTS

Figure 1:
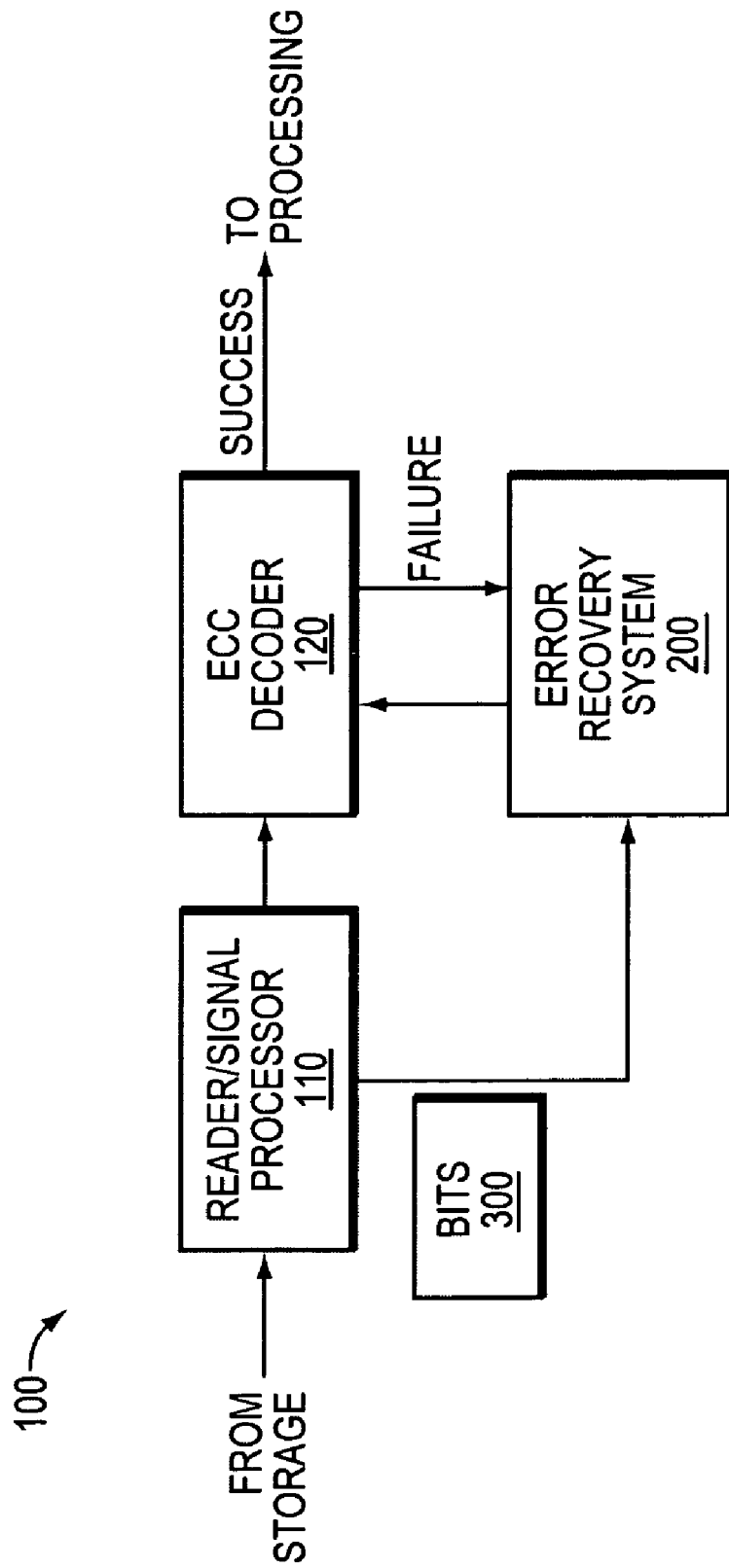
FIG. 1 illustrates an example device that advantageously may be used in accordance with the illustrative embodiments.

FIG. 1 illustrates portions of an example device 100 (e.g., portions of a disk drive) that advantageously may be used in accordance with the illustrative embodiments described herein. Device 100 may illustratively comprise reader/signal processor 110 (e.g., a bit detector) that operates in a known manner to assign values of 1 or 0 to bits of signals that are read/received from a storage medium (not shown). For example, the storage medium may be a configuration of one or more disks (e.g., magnetic, optical, etc.), tapes, solid state memory devices (e.g., flash devices), etc. Also, the signals may be received directly from the storage medium, or over a communications channel (e.g., serial interfaces, network interfaces, etc.), as will be understood by those skilled in the art. The reader 110 may provide the read bit values 300 (corresponding to codewords, e.g., divided into one or more symbols) to an error correction code (ECC) decoder 120, which may perform an error correction operation to determine if the retrieved data can be decoded to error-free data. If the ECC decoder 120 successfully decodes the data to error-free data, the system (device 100) sends the successful error-free data to processing (e.g., one or more processors, not shown). For example, an illustrative ECC decoding algorithm to operate on ECC codewords (e.g., one or more bits 300 and/or symbols, as described herein) is the known Reed-Solomon error correction algorithm.

In the event, however, that the ECC decoder 120 is unable to produce error-free data, the device 100 enters an error recovery mode, which illustratively includes the use of an error recovery system 200 in accordance with the present invention. In addition to providing the read bit values to the ECC decoder 120, the reader 110 also provides the read bit values (of a codeword) to the error recovery system 200. During error recovery mode, the device 100 continues re-reading ("retrying") the data until the codeword (e.g., sector) has been re-read a predetermined number of times. For example, the predetermined number of times may be selected to be essentially any number that can be completed within the duration of an associated error recovery time-out. The error recovery system may accumulate, for the respective bits, counts of the number of times that the bits are determined to be a "1" and/or a "0" for the retries. During the predetermined number of retries (or at the end of the predetermined number), the error recovery system 200 attempts to reconstruct the values of the respective bits based on the accumulated bit counts and sends the reconstructed values to the ECC decoder 120 for another attempt to produce error-free data. In other words, while conventional error recovery systems attempt to reconstruct data on each individual re-read, the present invention stores (buffers, accumulates, etc.) the read information from a plurality of retries to produce more information for use by the error recovery system and thus the ECC decoder 120. This process may continue until the recovery time-out or until error-free data is produced.

Illustratively, the error recovery system 200 may attempt to reconstruct the data of each codeword in accordance with one or more majority detection thresholds as described herein. In particular, the system 200 may utilize a "hard" majority detection to produce determined, or "voted upon" values (e.g., definite values 1 or 0) by comparing the counts to a majority detection threshold (e.g., the reconstructed bit value equals whichever value appears most during the multiple retries). Alternatively or in addition, the system 200 may utilize a "soft" majority detection to produce reliability (probability) information for each bit, indicating how certain the system 200 is that it has assigned the correct bit value. By comparing the reliability information to a threshold of uncertainty, "uncertain" bits may be used to determine possible erasure locations that may assist the ECC decoder 120 in its error correction operations (as will be understood by those skilled in the art and as described further herein).

Accordingly, by using majority detection (e.g., hard and/or soft), re-reading the data a plurality of times generates more information from which to base a bit value decision, since the added reliability information may be used to correctly assign bit values (certainty of value, 1 or 0) or to detect error locations (uncertainty of value), and the detected errors can then be corrected as erasures, i.e., errors with known locations. Further details of hard majority detection and soft majority detection in accordance with the present invention are now described in detail below.

Hard Majority Detection

According to hard majority detection, a device may retry reading a codeword having one or more bits 300 (e.g., corresponding to one or more symbols) for a plurality of retries, and store each retry. The device may then determine (vote on) a value of each bit of the codeword based on a majority of corresponding retry values in the plurality of corresponding retries. (Notably, a "codeword" as used herein may imply any number of bits/symbols to be decoded by the ECC such as one or more bits and/or one or more symbols.)

Figure 2:
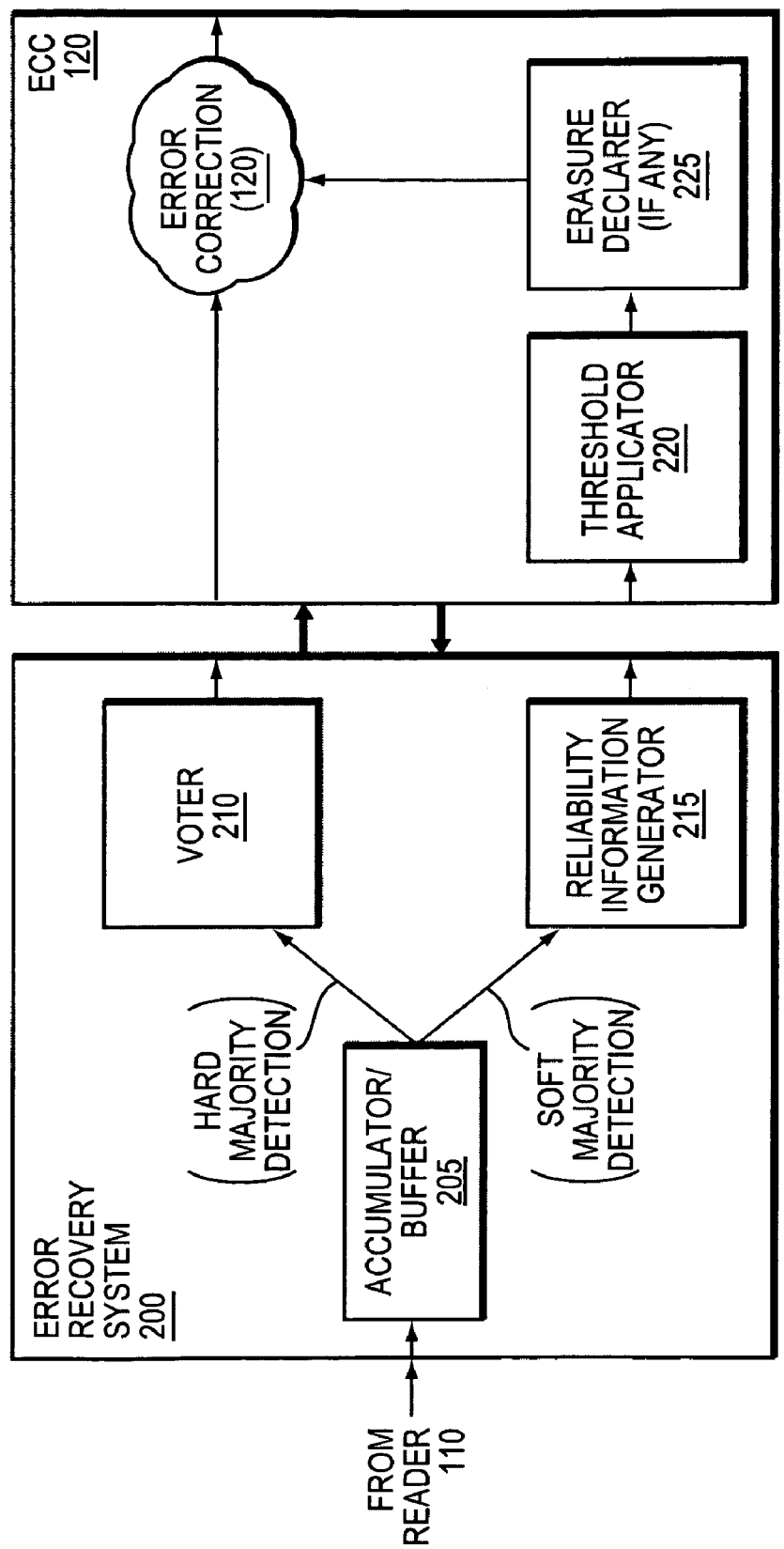
FIG. 2 illustrates an example error recovery system that advantageously may be used in accordance with the illustrative embodiments described herein.

Operationally, in an error recovery operation, data for each re-read (retry) are supplied from the reader 110 to the error recover system 200. FIG. 2 illustrates an example error recovery system that advantageously may be used in accordance with the illustrative embodiments described herein. In particular, the bit values 300 determined by the reader (e.g., bit detector) 110 are supplied to one or more accumulators/buffers 205, which for the respective bits accumulate counts that are equal to the number of times the given bits are detected as a particular value in the multiple re-reads. Illustratively, a single accumulator 205 keeps track of all retry bit values for each bit of the codeword. At the completion of the predetermined number of retries or at the completion of each retry (illustratively, each odd numbered retry) up to the predetermined number of retries, the counts in the accumulators 205 are provided to a voter 210. Voter 210 then compares each of the counts to a majority detection threshold (i.e., greater than 50%), to determine whether the corresponding bit should be reconstructed as a 1 or a 0. The voter 210 then sends the results to the ECC decoder 120, which attempts to produce error-free data therefrom. Illustratively, the number of retries for hard majority detection is an odd number of retries such that a "tie" does not exist between occurrences of 1's and 0's. In this manner, a binary decision (1 or 0) may be made for each bit value of the codeword (i.e., "hard" majority detection).

Figure 3:
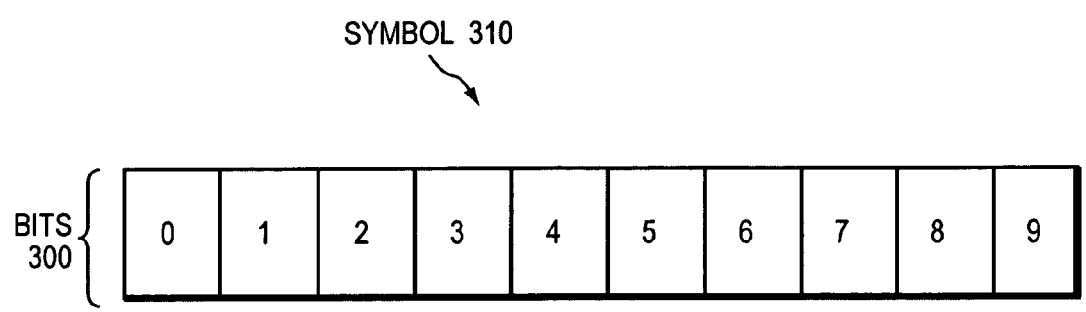
FIG. 3 illustrates an example symbol of bits that may be used in accordance with the illustrative embodiments described herein.

As an example, assume that a symbol 310 is as illustratively shown in FIG. 3, e.g., having ten bits 300 ("300.0" through "300.9" used herein). (Those skilled in the art will understand that any number of bits may be included within a symbol 310 and that any number of bits 300 and/or symbols 310 may be included within a codeword, and that the view shown herein of a single 10-bit symbol is for simplicity.) In response to the ECC decoder's inability to produce error-free data, the accumulator 205 may count how many times each bit value appears in a particular bit position of the codeword (e.g., of symbol 310). Illustratively, the accumulator 205 may be configured to count the number of times a 1 appears at each index. However, those skilled in the art will understand that the accumulator 205 may alternatively be configured to count the number of 0's, or to count the number of occurrences for each value.

Referring now to FIG. 4, table 400 illustrates as an example a result of performing five re-reads (retries) for the symbol 310. (As noted, the number of retries may be any number, and that the view shown herein is for simplicity. Those skilled in the art will understand that the greater number of retries, the more precise the results, yet at the cost of more elapsed time.) After the five retries, the stored bits of the codeword (e.g., of one or more corresponding symbols 310) are sent to a voter 210, where if the value of the accumulator (counting 1's) for the particular bit is larger than 3, that bit is voted as a 1, otherwise, as a 0. That is, whichever bit value appears most often becomes the hard majority detected voted value for that bit. For example, bits 300.0, 300.4, 300.5, 300.7; and 300.9 as shown illustrate that certain bits are repeatedly read at the same value, and are thus very likely to be read as the correct bit value. The remaining bits 300 without a consistent read value, however, are voted upon based on whichever value appears most often (i.e., greater than 50% of the time), since this value is somewhat more likely than its opposite value to be the actual bit value (although not necessarily). As a single example, bit 300.1 has three 1's and two 0's. By determining that there are three 1's (or that there are more 1's than 0's), the voter 210 may vote that the bit value is a 1.

If the voted upon bit values sent to the ECC decoder 120 result in error-free data (e.g., for an entire ECC codeword having a plurality of voted upon bits 300), then the bit values were voted upon correctly. If not, however, the error recovery system 200 may continue to retry reading the bits 300 (e.g., adding to the information already obtained or starting over with new information) and may continue voting and decoding until the data is error-free, or until the time-out expires. Notably, while the illustrative example is shown retrying each bit 300 of the entire symbol 310 (and/or codeword) at once for each retry, other embodiments may be configured to read, store, and vote on each bit individually, and thus the voter 210 may frame the voted bits into the appropriate symbol/codeword length for the ECC decoder 120.

Figure 5:
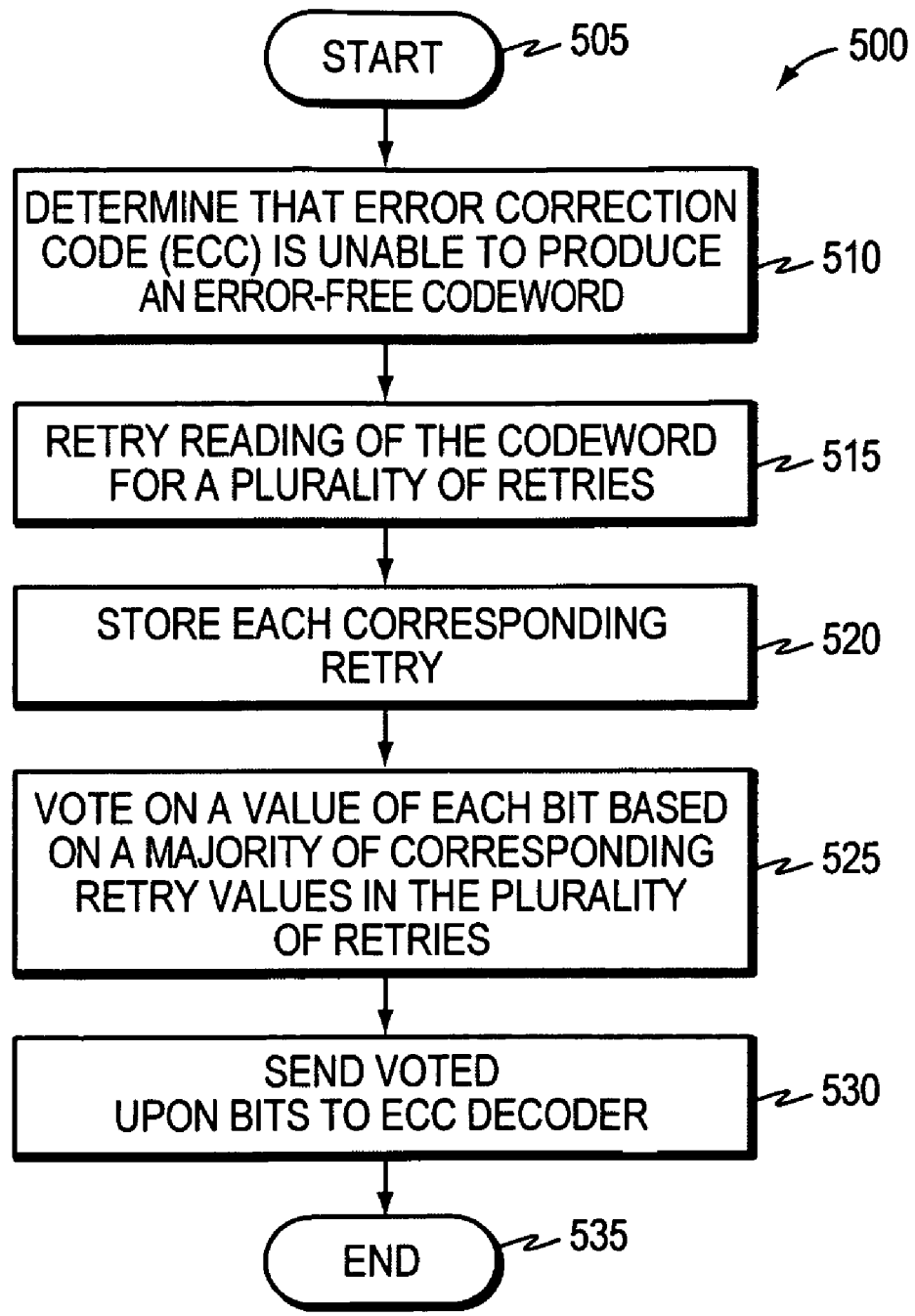
FIG. 5 is a flowchart illustrating a procedure for hard majority detection in accordance with the present invention.

FIG. 5 is a flowchart illustrating a procedure for hard majority detection in accordance with the present invention. The procedure 500 starts at step 505, and continues to step 510, where the device 100 determines that the ECC decoder 120 is unable to produce an error-free result of a read codeword having one or more bits (e.g., corresponding to one or more symbols 310). In response, the device 100 retries reading the codeword for a plurality of retries in step 515 and stores each corresponding retry (e.g., in accumulator/buffer 205) in step 520 (after each retry).

As the device retries reading the bits over time, the device (e.g., error recovery system 200) votes on a value of each bit of the codeword (e.g., voter 210) based on a majority of corresponding retry values in the plurality of retries in step 525. Each newly voted upon bit (or, notably, final voted bits, described above), is sent to the ECC decoder 120 in step 530, e.g., as an entire codeword or symbol. For example, as described above, each iteration of the bits 300 may result in a new vote of the values until a configurable number of iterations/retries (e.g., 15) have been completed, a configurable time-out has is been reached, or the ECC decoder 120 successfully decodes the data. The procedure 500 thus ends in step 535 after either a successful ECC decoding operation, or a sufficient number of retries have occurred by repeatedly performing steps 510-530 above, or a time-out has been reached (expired). Notably, while the flowchart above is shown and described in a linear order of steps, those skilled in the art will appreciate that the steps (e.g., retrying a plurality of reads) may be repeated and/or completed simultaneously, and that the view shown herein is for simplicity and is merely a representative example.

Soft Majority Detection

Alternatively or in addition, according to soft majority detection, a device 100 again may retry reading a codeword having one or more bits 300 (e.g., corresponding to one or more symbols 310) for a plurality of retries, and store each retry. The device determines reliability information for a value of each bit of the codeword based on a reoccurrence ratio of corresponding retry values in the plurality of corresponding retries. The device may then declare erasures (e.g., bits and/or symbols) based on the reliability information and a threshold of uncertainty, e.g., where an "uncertain" bit based on the threshold or any symbol with an "uncertain" bit is declared as an erasure to assist error correction.

Operationally, in an error recovery operation, data for each re-read (retry) is supplied from the reader 110 to the error recover system 200 in a similar manner to that described above with reference to hard majority detection. Here, at the completion of the predetermined number of retries or at the completion of each retry (illustratively, any numbered retry) up to the predetermined number of retries, the counts in the accumulators 205 are provided to a reliability information generator 215 (e.g., a process, code, hardware, and/or firmware adapted to operate accordingly). Reliability information generator 215 generates a probability figure (soft/reliability information) representative of the reoccurrence ratio of each bit value, e.g., a percent, ratio, or number of times a certain value (e.g., 1) is read as a particular bit value. The higher the reoccurrence ratio of each bit value, the greater is the likelihood that the value is assigned correctly. For instance, the reliability information generator 215 may act like the hard majority detection voter 210 above, by first determining a bit value that has appeared most often in the retries. Then the generator 215 may apply reliability information to that corresponding value accordingly (e.g., voting a 1, then determining how reliable that vote is).

As an example of soft majority detection, referring now to FIG. 6, table 600 illustrates as an example a result of performing five re-reads (retries) for symbol 310 (e.g., the same results as in table 400 above). After the five retries, the stored bits are sent to a reliability information generator 215, where the counts from the accumulator 205 for each bit are applied to a reliability generation process (e.g., a calculation of a ratio, percentage, etc.). For example, each bit value's percent value (e.g., as corresponding to a 1 and a 0) is illustratively shown, such as 0.6 (60%) reliability that bit 300.1 is a 1, while 0.8 (80%) reliability that bit 300.3 is a 0. As noted, the accumulator 205 and reliability information generator 215 may determine reliability information values for both bit values (1 and 0), or simply just one (e.g., 1), thus determining the opposite reliability information value at the same time (i.e., the reciprocal) in a manner that will be easily understood (e.g., where reliability information for bit 300.1 being a "1"=0.6, then 1.0−0.6=0.4 for 300.1 being a "0").

The voted upon bits 300 of a codeword and corresponding reliability information may be sent to the ECC decoder 120. The ECC decoder may then use known reliabilityassisted ECC decoding (soft ECC decoding) to attempt to correct the ECC codeword associated with the received bits 300. Examples of soft ECC decoding include, inter alia, Generalized Minimum Distance (GMD) decoding, Chase decoding, and Algebraic Soft Decoding (ASD) for the Reed-Solomon ECC code, e.g., in accordance with an (n,k) distance d Reed Solomon ECC. For instance, reliability information of a symbol 310 of a codeword may equate to the reliability of the least reliable bit 300 of the symbol. For example, the lowest reliability of symbol 310 in FIG. 6 corresponds to 0.6 (60%) according to bits 300.1, 300.6, and/or 300.8.

Illustratively, in accordance with one or more embodiments of the present invention, a threshold applicator 220 at the ECC decoder 120 may apply one or more thresholds (e.g., majority detection thresholds and/or thresholds of uncertainty) to the received information to assist in correcting the codeword (e.g., bits 300 and/or symbols 310) accordingly. That is, by applying thresholds to the reliability information, the soft majority detection of the present invention effectively divides the bit values into three declarable regions: 1, 0, or "uncertain" (ambiguous), e.g., "U" in FIG. 6. For instance, the threshold applicator 220 may determine that any bit value with reliability (a reoccurrence ratio) greater than the threshold of uncertainty may be declared to be that value, while any value less than the threshold (i.e., and not above the threshold for the opposite value) is an uncertain value. Therefore, bit values of 1, 0, and uncertain have defined windows into which a declared bit value may fall based on the reliability information. (Notably, a threshold of uncertainty equal to 50% is substantially similar to hard majority detection, e.g., no bits are declared to be uncertain, only 1's and 0's.)

The threshold applicator 220 may configure the threshold of uncertainty, e.g., based on the error correction capabilities of the ECC decoder 120. That is, from the bit values and corresponding reliability information, the threshold applicator 220 may apply a configured threshold of uncertainty (e.g., 75%) in order to determine a set of uncertain bits. For instance, the symbol 300 as shown in FIG. 6 may have three uncertain bits (i.e., where bits 300.1, 300.6, and 300.8 are uncertain) based on the reliability information and threshold.

After the threshold applicator 220 determines which bits 300 are uncertain bits, the erasure declarer 225 identifies those bits as erasures. The erasure declarer 225 then sets erasure pointers that identify the locations of the likely erroneous bits in the ECC codeword, and uses the erasure pointers in the ECC decoder 120 to assist in error correction (e.g., attempting to produce error-free data therefrom). The decoder 120 operates in a known manner to attempt to produce error-free data therefrom, such as by attempting to correct errors in the erasures using the voted upon bits (and reliability information) of the remaining (non-erasure) bits 300 of the codeword accordingly.

Further, i.e., for symbol-based erasure declarations, symbols that are associated with at least one uncertain bit (e.g., an erasure bit) may be declared as erasures accordingly. For example, any symbol 300 having any uncertain bit (i.e., a bit having reliability below the configurable threshold) may be declared as an erasure. Alternatively or in addition, the threshold applicator 220 may also be configured to identify erasures as a certain number of symbols having the lowest reliability (e.g., a single value or an average or weighted average of reliability information values), symbols having more than a certain number of uncertain bits (e.g., two, three, etc.), and so forth.

Notably, it is generally beneficial to declare a number of erasures (e.g., in response to the dynamic threshold and/or the bit/symbol reliability) that is less than the total erasure correction capability of the ECC decoder 120. In this way, the system may also determine if any bits/symbols otherwise determined to be reliable may have been reconstructed incorrectly.

If the assigned bit values and reliability information sent to the ECC decoder 120, and/or declarations of erasures decode to error-free data, the system ends its error recovery operations. If not, the error recovery system 200 (in conjunction with ECC decoder 120) continues to retry reading the bits 300 (e.g., of a codeword) for additional retries until the error is corrected, or until the time-out expires.

Also, in accordance with one or more embodiments of the present invention, the error recovery system (e.g., as part of ECC decoder 120) may dynamically adjust the threshold of uncertainty (i.e., to include or remove erasures from the ECC codeword) until the error is corrected, or until the time-out expires. For instance, in conjunction with the erasure declarer 225, the threshold applicator 220 may dynamically adjust the threshold to provide more or fewer declared erasures, e.g., bits 300 and/or symbols 310 as described above. For example, adjusting the threshold to 55% would result in all bits being declared as a 1 or a 0 accordingly (which, illustratively, would result in no declared erasures of the bits of symbol 310). Alternatively, had the original threshold been 55%, and to the threshold were adjusted to 75%, bits 300.1, 300.6, and 300.8 would become uncertain, and those bits and/or corresponding symbol 310 may thus be declared as an erasure. In this manner, more or fewer erasures may be declared at the ECC decoder 120 in order to assist error correction, as will be appreciated by those skilled in the art. For instance, by dynamically adjusting the threshold, and thus the number of erasures, the present invention helps to partition the power of the ECC (determined by $d_{min}$) between the number of erasures and the number of errors, allowing the ECC to apply more or less power to either erasures or random errors accordingly.

One advantageous example of dynamically adjusting the threshold comprises first declaring as erasures the bits/symbols with the lowest reliability, and then continuing to declare erasures for the next lowest reliability and so forth until the ECC decoder 120 is able to produce error-free data (or, for example, until too many erasures are present, at which time the error recovery system 200 may stop, or start over). Those skilled in the art will understand that dynamically adjusting the threshold to include as erasures the lowest reliability bits/symbols, then next lowest reliable bits/symbols, etc. is merely an example, and that any dynamic adjustments may be made to the threshold accordingly (e.g., trying each threshold in any order until the ECC codeword can be corrected).

Notably, both hard majority detection and soft majority detection may be used individually or in a combined manner. For example, hard majority detection may be used to make a binary decision as to whether the respective bit values 300 should be 1s or 0s. Then soft majority detection may be used for each bit to determine the corresponding reliability information. In other words, hard majority detection declares bit values based on the hard majority detection threshold, then soft majority detection may be used to determine how reliable that declaration is (or isn't).

Figure 7:
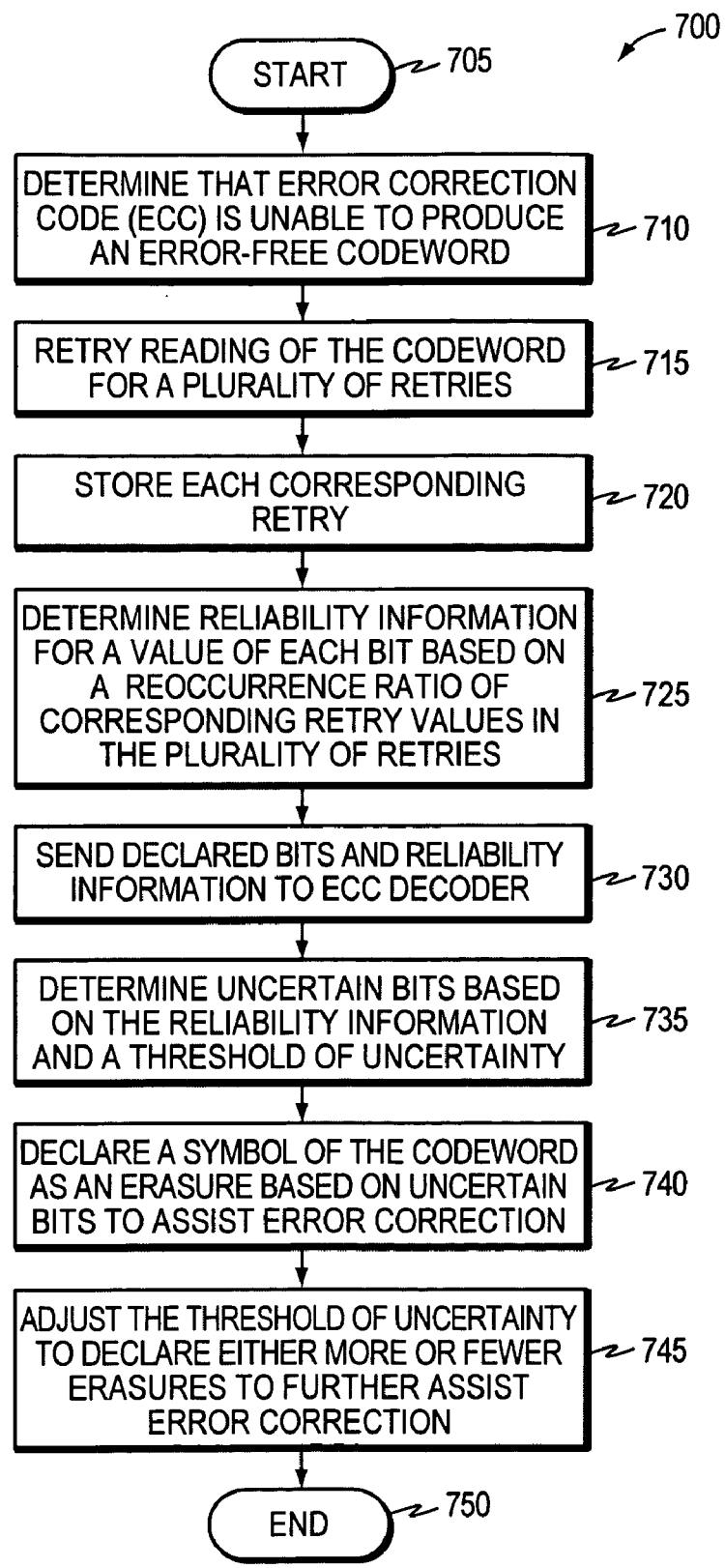
FIG. 7 is a flowchart illustrating a procedure for soft majority detection in accordance with the present invention.

FIG. 7 is a flowchart illustrating a procedure for soft majority detection in accordance with the present invention. The procedure 700 starts at step 705, and continues to step 710, where the device 100 determines that the ECC decoder 120 is unable to produce an error-free result of a read codeword having one or more bits 300 (e.g., corresponding to one or more symbols 310). In response, the device 100 retries reading of the codeword for a plurality of retries in step 715 and stores each corresponding retry (e.g., in accumulator/buffer 205) in step 720 (e.g., after each retry).

As the device retries reading the bits over time, the device (e.g., error recovery system 200) determines reliability information for a value of each bit of the codeword (e.g., reliability information generator 215) based on a reoccurrence ratio of corresponding retry values in the plurality of retries in step

725. The voted upon bits (e.g., described is above for hard majority detection) and reliability information is sent to the ECC decoder 120 in step 740 (e.g., as a codeword, as described above).

By applying the configured thresholds as described above in step 735 (e.g., at threshold applicator 220), the ECC decoder 120 of error recovery system 200 may determine uncertain bits 300 (e.g., to be declared an erasure) based on the reliability information and a threshold of uncertainty. A symbol may be declared as an erasure in step 740 (e.g., erasure declarer 225) based on having an uncertain bit to assist error correction, as described above.

If necessary (i.e., if error correction is not successful), in step 745 the error recover system 200 (e.g., threshold applicator 220 of ECC decoder 120) may adjust the threshold of uncertainty to declare either more or fewer erasures to further assist error correction as described above. (In addition, more retries of the bits may also continue, which, as described above, may increase the precision of the reliability information accordingly.) The procedure 700 ends in step 750 after either a successful ECC decoding operation, or a sufficient number of retries have occurred by repeatedly performing steps 710-745 above, or a time-out has occurred without a successful error correction. Notably, as mentioned above for hard majority detection, while the flowchart above is shown and described in a linear order of steps, those skilled in the art will appreciate that the steps (e.g., retrying a plurality of reads) may be repeated and/or completed simultaneously, and that the view shown herein is for simplicity and is merely a representative example.

As those skilled in the art will appreciate, majority detection in accordance with the present invention fits naturally into the error recovery mode. For instance, conventional ECC and error correction techniques may still be applied, however in accordance with the present invention, better information may be provided to the ECC decoder 120, such as voted upon bit values, associated reliability information, and/or erasure declarations based on an aggregation of multiple retry values. For example, by providing probabilistically accurate bit values and declared erasures, the majority detection techniques may efficiently reduce the number of errors the ECC must correct to within the ECC's correction capabilities. Also, one or more embodiments of majority detection may illustratively involve only firmware and/or software modifications without any additional hardware support, as will be understood by those skilled in the art, thus being applicable to error recovery modes of storage systems without requiring new hardware.

Further, one or more enhancements may be made to the above description that would remain within the scope of the present invention. For example, one enhancement in accordance with the present invention is to provide multiple hardware instances (e.g., multiple readers 110) to provide multichannel detection for a single compiler. That is, the multiple readers 110 (e.g., read heads) may read the same block of data (e.g., a sector and/or codeword) on a single pass of the data to provide multiple retry reads in accordance with the embodiments described above. In this manner, fewer physical retries (e.g., disk revolutions) need occur to achieve a greater number of retry values. Also, for soft majority detection and erasure declaration, a confidence of which bits/symbols to declare as erasures may be raised using one or more conventional possible erasure indicators. For example, various flags for possible erasures may be included with the symbols to indicate, inter alia, locations of thermal asperity, or "TA" (e.g., where the reader 110 touches a defect on the disk, and the temperature of the sensor changes, resulting in a distortion of the read-back signal; the TA indication points out where thermal asperity was detected), locations of illegal patterns (e.g., a bit pattern not possible due to coding constraints), etc.

Advantageously, the invention provides efficient techniques for majority detection in error recovery (e.g., correction and/or detection). By providing additional reliability information through a comparison of multiple read retries (e.g., hard and/or soft), the novel techniques provide an additional input to error detection and correction. Further, the inventive system utilizes the hard and soft majority detection to recover data that would otherwise be labeled as uncorrectable, or bad, because the number of errors exceeds the error correction capability of the ECC. For example, hard and soft majority detection may provide significant gain improvements over conventional detection means to detect and/or correct errors.

While there has been shown and described illustrative embodiments that provide efficient techniques for majority detection in error recovery, it is to be understood that various other adaptations and modifications may be made within the spirit and scope of the present invention. For example, although the present invention is described for use in a disk drive, it should be expressly understood that the present invention is applicable to other electronic systems, including data storage devices (e.g., tape drives, memory devices, solid state devices, etc.) and communication channels (e.g., wireless communication, the Internet, buffered transmission signals, etc.). Also, while the above description has been described referencing bits and symbols and codewords, those skilled in the art will understand that the terms may be used interchangeably where applicable, such as reliability information of a bit or symbol, erasure of a bit or symbol, reading the bit, symbol, or codeword, etc. Furthermore, the description is not intended to limit the invention to the form disclosed herein. Consequently, variations and modifications commensurate with the following teachings, and skill and knowledge of the relevant art, are within the scope of the present invention.

The foregoing description has been directed to specific embodiments of this invention. It will be apparent, however, that other variations and modifications may be made to the described embodiments, with the attainment of some or all of their advantages. For instance, the embodiments described herein may be implemented in hardware, software, firmware, and/or combinations thereof. Accordingly this description is to be taken only by way of example and not to otherwise limit the scope of the invention. Therefore, it is the object of the appended claims to cover all such variations and modifications as come within the true spirit and scope of the invention.

What is claimed is:

1. A method comprising:
   receiving a plurality of retry bit values for each bit of a codeword having one or more bits, each retry bit value associated with one of a plurality of retries, each retry comprising a separate read of the codeword from a storage location;
   for at least one bit of the codeword, an accumulator counting the number of occurrences of at least one retry bit value across the plurality of retries; and
   determining a value of at least one bit of the codeword based on a majority of corresponding retry bit values of the at least one bit in the plurality of retries.

2. The method as in claim 1, further comprising:
   performing the steps of receiving and determining in response to an error recovery mode caused by a failure of an error correction code (ECC) decoder to correct a first codeword.

3. The method as in claim 1, further comprising:
   receiving a plurality of retries using multiple read mechanisms on a single pass of the codeword.

4. The method as in claim 1, further comprising:
   receiving a plurality of retries until a retry time-out expires.

5. The method as in claim 1, further comprising:
receiving a plurality of retries until an error correction code (ECC) decoder successfully corrects the codeword.

6. The method as in claim 1, wherein the step of determining further comprises:
determining reliability information for a value of at least one bit of the codeword based on a reoccurrence ratio of corresponding retry values in the plurality of retries;
determining whether the at least one bit value is uncertain based on the reliability information and a threshold of uncertainty; and
declaring an uncertain bit as an erasure.

7. The method as in claim 6, further comprising:
declaring a symbol of the codeword as an erasure in response to a bit declared as an erasure within the symbol.

8. A method comprising:
receiving a codeword having one or more bits for a plurality of retries, each retry comprising a separate estimation of the values of the bits of the codeword; and
an error recovery system determining reliability information for a value of at least one bit of the codeword based on a reoccurrence ratio of corresponding retry values of the at least one bit in the plurality of retries.

9. The method as in claim 8, further comprising:
determining whether the at least one bit value is uncertain based on the reliability information and a threshold of uncertainty; and
declaring an uncertain bit as an erasure.

10. The method as in claim 9, further comprising:
declaring a symbol of the codeword as an erasure in response to a bit declared as an erasure within the symbol.

11. The method as in claim 9, further comprising:
adjusting the threshold of uncertainty to declare either more or fewer erasures.

12. The method as in claim 9, further comprising:
adjusting the threshold of uncertainty to provide a number of erasures that is within an error correction ability of an error correction code (ECC) decoder.

13. The method as in claim 9, further comprising:
setting the threshold of uncertainty equal to 50%, wherein no bits are determined to be uncertain.

14. The method as in claim 9, further comprising:
providing additional erasure confidence to the declared erasures based on one or more additional erasure possibility indications.

15. The method as in claim 14, wherein the additional erasure possibility indications are selected from a group consisting of: thermal asperity indications and illegal pattern indications.

16. The method as in claim 9, further comprising:
adjusting the threshold of uncertainty to declare a most confident erasure first; and
adjusting the threshold of uncertainty to declare zero or more next most confident erasures until an error correction code (ECC) decoder is able to correct the codeword.

17. The method as in claim 9, further comprising:
declaring a bit value as a 1 if the reliability information indicates that a majority of retry values are 1 and the reliability information is greater than the threshold of uncertainty;
declaring a bit value as a 0 if the reliability information indicates that a majority of retry values are 0 and the reliability information is greater than the threshold of uncertainty; and
determining that a bit value is uncertain if the reliability information for the majority of either retry value is less than the threshold of uncertainty.

18. The method as in claim 8, further comprising:
determining the value of the at least one bit of the codeword based on a majority of corresponding retry values of the at least one bit in the plurality of retries; and
determining the reliability information for the determined value of the at least one bit of the codeword.

19. The method as in claim 8, further comprising:
utilizing with the reliability information one of either a Generalized Minimum Distance (GMD) decoding, a Chase decoding, and an Algebraic Soft Decoding (ASD).

20. An apparatus comprising:
means for receiving a codeword having one or more bits for a plurality of retries, each retry comprising a separate determination of the values of the bits in the codeword;
means for determining a value of at least one bit of the codeword based on a majority of corresponding retry values of the at least one bit in the plurality of retries; and
means for determining reliability information for the determined value of the at least one bit of the codeword based on a reoccurrence ratio of corresponding retry values of the at least one bit in the plurality of retries.

* * * * *